(12) United States Patent
Yuan et al.

(10) Patent No.: US 7,887,337 B1
(45) Date of Patent: Feb. 15, 2011

(54) ELECTRICAL CONNECTOR

(75) Inventors: Sheng-Tsung Yuan, Taipei (TW);
Chin-Chou Wang, Taipei (TW)

(73) Assignee: Cheng Uei Precision Industry Co., Ltd., Taipei (TW)

( * ) Notice: Subject to any disclaimer, the term of this patent is extended or adjusted under 35 U.S.C. 154(b) by 0 days.

(21) Appl. No.: 12/700,744

(22) Filed: Feb. 5, 2010

(51) Int. Cl.
*H01R 12/00* (2006.01)
*H05K 1/00* (2006.01)

(52) U.S. Cl. ........................................ 439/76.1; 439/92
(58) Field of Classification Search ................ 439/76.1, 439/629, 101, 92
See application file for complete search history.

(56) References Cited

U.S. PATENT DOCUMENTS 6,231,356 B1 * 5/2001 Stutts et al. .................... 439/92
7,806,701 B2 * 10/2010 Tochi et al. .................. 439/76.1

* cited by examiner

*Primary Examiner*—Javaid Nasri

(57) ABSTRACT

An electrical connector includes a housing, a circuit board, a cover and a ground element. The housing has a first side wall and a second side wall, the first and second side walls define a first inserting slot and a second inserting slot, respectively. The circuit board is mounted in the housing and defines a plurality of contact terminals. The cover is supported on the side walls and defines a plurality of locating grooves. The ground element is mounted to the housing and has an elastic cantilever arm, one end of the ground element opposite to a free end of the cantilever arm passes through the first inserting slot firstly and then the second inserting slot, the cantilever arm enters into an inside of the housing from the first inserting slot and then springs up to make the free end thereof blocked by the first side wall.

6 Claims, 3 Drawing Sheets

ELECTRICAL CONNECTOR

BACKGROUND OF THE INVENTION

1. Field of the Invention

The present invention generally relates to an electrical connector, and more particularly to an electrical connector which can eliminate static electricity.

2. The Related Art

An electrical connector is adapted to connect a wireless subsidiary telephone and a main telephone during charging courses. The conventional electrical connector generally includes a housing, a circuit board and a cover. The circuit board defines two rows of contact terminals, the cover defines a plurality of locating grooves for being mated with the terminals, the circuit board is mounted in the housing, the cover is mounted to a top of the housing, the two rows of the contact terminals penetrate through the locating grooves of the cover to be exposed from the cover. When the electrical connector is in use, the two rows of the contact terminals are respectively connected with the main telephone and the subsidiary telephone, so that the tandem function is realized. However, when the subsidiary telephone is connected with the main telephone or taken away from the main telephone, the static electricity from the people will easily result in bad effect on the telephone components, while it is difficult for the electrical connector as described above to eliminate the effect of static electricity.

SUMMARY OF THE INVENTION

An object of the present invention is to provide an electrical connector. The electrical connector includes a housing, a circuit board, a cover and a ground element. The housing has a first side wall and a second side wall opposite to the first side wall, the first and second side walls define a first inserting slot and a second inserting slot at opposite portions thereof, respectively. The circuit board is mounted in the housing and defines a plurality of contact terminals. The cover is supported on the side walls, the cover defines a plurality of locating grooves for allowing the contact terminals of the circuit board exposed therefrom. The ground element is of board shape mounted to the housing, a portion of the ground element apart from two opposite ends of the ground element has an elastic cantilever arm, one end of the ground element opposite to a free end of the cantilever arm passes through the first inserting slot firstly and then the second inserting slot, the cantilever arm enters into an inside of the housing from the first inserting slot and then springs up to make the free end thereof blocked by the first side wall.

As described above, when the electrical connector in accordance with the present invention is in use, the contact terminals of the electrical connector are respectively connected with the circuit terminals of the main telephone and the subsidiary telephone of the related art described above, one side of the ground element is connected with the subsidiary telephone, and the other side of the ground element is connected with the ground device of the main telephone, so that the static electricity is eliminated.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
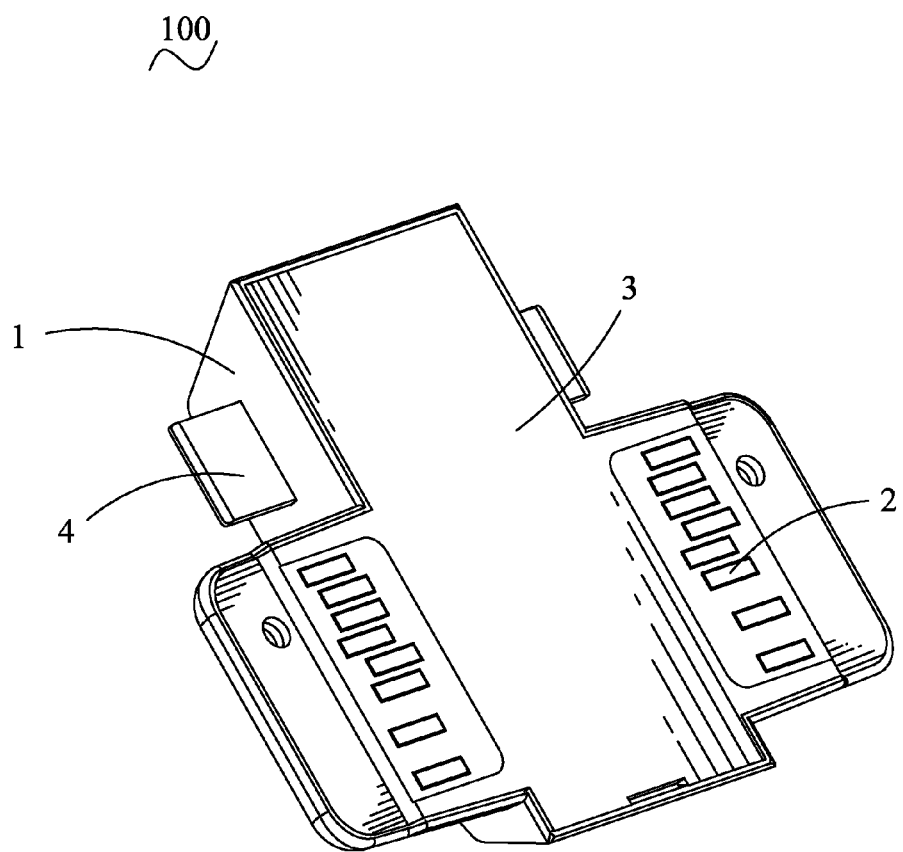
FIG. 1 is a perspective view of an electrical connector in accordance with the present invention.
Figure 2:
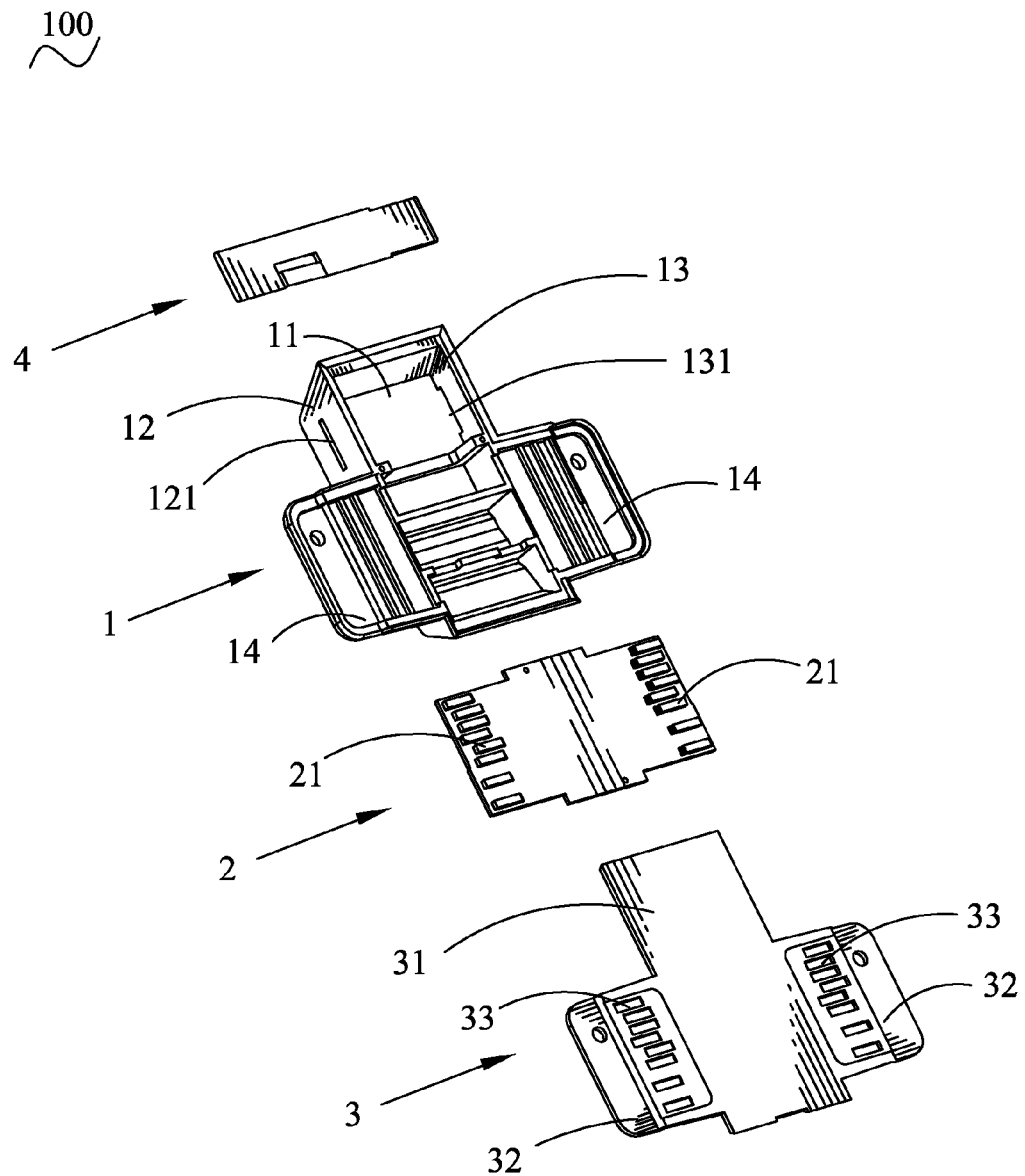
FIG. 2 is an exploded perspective view of the electrical connector of FIG. 1.

With reference to FIG. 1 and FIG. 2, an electrical connector 100 in accordance with the present invention is shown. The electrical connector 100 includes a housing 1, a circuit board 2, a cover 3 and a ground element 4.

Referring to FIG. 2, the housing 1 defines a bottom wall 11, two opposite sides of the bottom wall 11 respectively extend upward to form a first side wall 12 and a second side wall 13. The first and second side walls 12, 13 define a first inserting slot 121 and a second inserting slot 131 opposite to the first inserting slot 121 at lower portions of rears thereof, respectively. Two wings 14 are extended outwards from tops of fronts of the two side walls 12, 13, respectively. A front and a rear of the bottom wall 11 extend upward to form a front wall (not labeled) and a rear wall (not labeled) connected with the two side walls 12, 13.

Referring to FIG. 2, the circuit board 2 is of a rectangular configuration, two ends of the circuit board 2 define two rows of contact terminals 21, respectively. The cover has a rectangular base body 31, two opposite sides of a front of the base body 31 respectively extend outward to form two side bodies 32, the two side bodies 32 define two rows of locating grooves 33 for being mated with the contact terminals 21, respectively.

Figure 3:
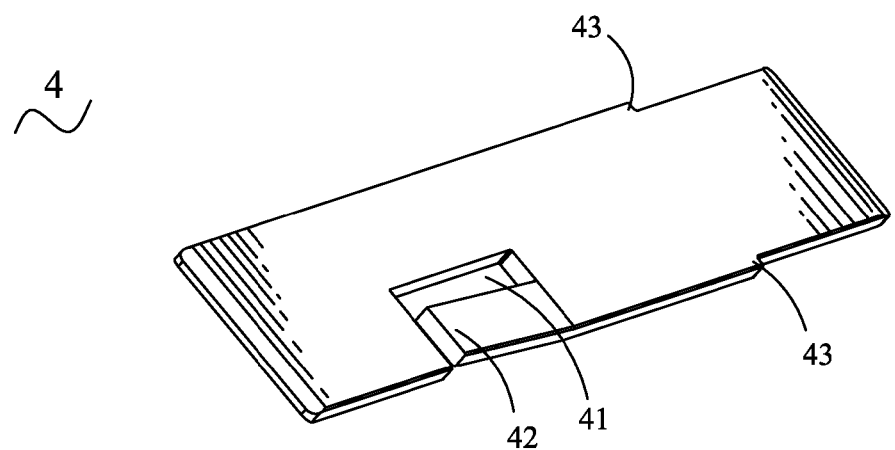
FIG. 3 is a perspective view of a ground element of the electrical connector of FIG. 1.

Referring to FIG. 2 and FIG. 3, the ground element 4 is of board shape, and is stamped from a sheetmetal. A portion of the ground element 4 apart from two opposite ends of the ground element 4 defines a gap 41 in a front side thereof. A front of a side of the gap 41 extends towards an opposite side thereof and inclines upward to form an elastic cantilever arm 42 which can move downward with the external force to be received in the opening groove 41. A front side and a rear side of one end of the ground element 4 opposite to a free end of the cantilever arm 42 respectively concave inward to form a lacking groove (not labeled) with one end thereof passing through the corresponding end of the ground element 4 and the other end thereof being formed to a shoulder 43.

Figure 4:
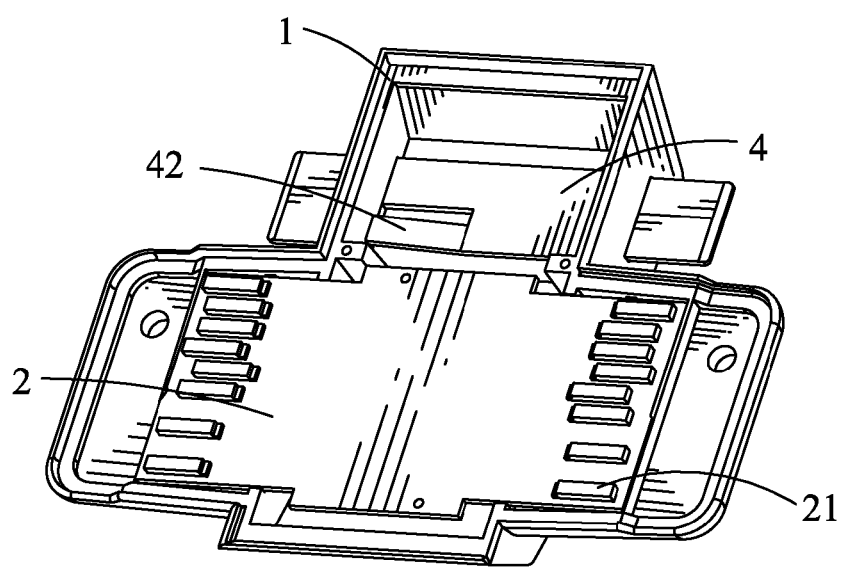
FIG. 4 is a perspective view of the electrical connector without a cover of FIG. 1.

Referring to FIG. 1, FIG. 2 and FIG. 4, when the electrical connector 100 in accordance with the present invention is assembled, one end of the ground element 4 opposite to a free end of the cantilever arm 42 passes through the first inserting slot 121 firstly and then the second inserting slot 131, the cantilever arm 42 enters into an inside of the housing 1 from the first inserting slot 121 and then springs up to make the free end of the cantilever arm 42 abut against an inside of the first side wall 12 of the housing 1, and the two shoulders 43 of the ground element 4 abut against an inside of the second side wall 13 of the housing 1, the two ends of the ground element 4 are respectively exposed to a corresponding outside of the first side wall 12 and the second side wall 13, so that the ground element 4 is mounted to the housing 1 firmly and the effect of locating and preventing receding is realized. The circuit board 2 is mounted in the front of the housing 1 with the two ends of the circuit board 2 being placed on the swings 14. The cover 3 is mounted to a top of the housing 1, the contact terminals 21 of the circuit board 2 penetrates through the locating grooves 33 of the cover 3 to be exposed from the cover 3.

As described above, when the electrical connector 100 in accordance with the present invention is in use, the contact terminals 21 of the electrical connector 100 are respectively connected with the circuit terminals of the main telephone and the subsidiary telephone of the related art described above, one side of the ground element 4 is connected with the subsidiary telephone, and the other side of the ground element 4 is connected with the ground device of the main telephone, so that the static electricity is eliminated.

What is claimed is:

1. An electrical connector, comprising:
   a housing having a first side wall and a second side wall opposite to the first side wall, the first and second side walls defining a first inserting slot and a second inserting slot at opposite portions thereof, respectively;
   a circuit board mounted in the housing and defining a plurality of contact terminals;
   a cover supported on the side walls, the cover defining a plurality of locating grooves for allowing the contact terminals of the circuit board exposed therefrom; and
   a ground element of board shape mounted to the housing, a portion of the ground element apart from two opposite ends of the ground element having an elastic cantilever arm, one end of the ground element opposite to a free end of the cantilever arm passing through the first inserting slot firstly and then the second inserting slot, the cantilever arm entering into an inside of the housing from the first inserting slot and then springing up to make the free end thereof blocked by the first side wall.

2. The electrical connector as claimed in claim 1, wherein one end of the ground element opposite to the free end of the cantilever arm defines two shoulders abutting against an inside of the second side wall.

3. The electrical connector as claimed in claim 2, wherein the free end of the cantilever arm abuts against the first side wall when the shoulders abut against the second side wall.

4. The electrical connector as claimed in claim 1, wherein a side of the ground element defines a gap, the cantilever arm extends towards an opposite side of the gap from a side of the gap and inclines upward.

5. The electrical connector as claimed in claim 1, wherein two wings are extended outwards from tops of fronts of the two side walls, respectively, two ends of the circuit board are placed on the wings, the first inserting slot and the second inserting slot are defined at lower portions of rears of the two side walls, respectively.

6. The electrical connector as claimed in claim 5, wherein the two ends of the circuit board define two rows of contact terminals, respectively, the cover defines two rows of locating grooves corresponding to the two rows of contact terminals.

* * * * *